United States Patent
Shen et al.

(10) Patent No.: US 10,085,089 B1
(45) Date of Patent: Sep. 25, 2018

(54) LOAD CURRENT SENSING CIRCUIT FOR CLASS-D AMPLIFIER

(71) Applicant: SYNAPTICS INCORPORATED, San Jose, CA (US)

(72) Inventors: Dan Shen, Irvine, CA (US); Lorenzo Crespi, Costa Mesa, CA (US); Davide Cartasegna, Oceanside, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/817,091

(22) Filed: Nov. 17, 2017

(51) Int. Cl.
  *H04R 3/00* (2006.01)
  *H01L 29/78* (2006.01)
  *G11C 27/02* (2006.01)
  *H03F 3/185* (2006.01)
  *H03F 3/217* (2006.01)

(52) U.S. Cl.
  CPC .......... *H04R 3/007* (2013.01); *G11C 27/024* (2013.01); *H01L 29/7816* (2013.01); *H03F 3/185* (2013.01); *H03F 3/2173* (2013.01); *H03F 2200/03* (2013.01); *H03F 2200/462* (2013.01); *H03F 2200/474* (2013.01)

(58) Field of Classification Search
  CPC ............. H03F 3/2173; H03F 2200/351; H03F 1/0205; H03F 3/45273; H03F 2200/393; H03F 2200/18; H03F 2200/294; H03F 2200/72; H03F 3/45995; H03F 1/303; H04R 3/007; H03K 17/0822; G11C 27/02
  See application file for complete search history.

(56) References Cited

U.S. PATENT DOCUMENTS

| | | | |
|---|---|---|---|
| 2012/0044020 A1* | 2/2012 | Siniscalchi | H03F 3/2173 330/251 |
| 2017/0085233 A1* | 3/2017 | Berkhout | H03F 3/45995 |
| 2017/0373655 A1* | 12/2017 | Mengad | H03F 3/185 |
| 2018/0014119 A1* | 1/2018 | Chawla | H04R 3/007 |

\* cited by examiner

*Primary Examiner* — Mohammad Islam
(74) *Attorney, Agent, or Firm* — Haynes and Boone, LLP

(57) ABSTRACT

Systems and methods according to one or more embodiments are provided for sensing a current at an output of a switching amplifier. In one example, a system includes a first transistor switch coupled to a load configured to conduct a current in the load responsive to a first pulse width modulated control signal and a second transistor switch coupled to the load configured to conduct the current in the load responsive to a second pulse width modulated control signal. The system further includes a sample and hold circuit coupled between the load and a current sensing circuit configured to sample a voltage at the second transistor switch for a pre-determined sample time period in response to a midpoint of a second pulse width modulated control signal time period, and configured to provide the sampled voltage to the current sensing circuit.

20 Claims, 5 Drawing Sheets

LOAD CURRENT SENSING CIRCUIT FOR CLASS-D AMPLIFIER

TECHNICAL FIELD

The present invention relates generally to signal processing and, more particularly, to sensing a current at a switching amplifier output stage.

BACKGROUND

Many modern devices such as laptop computers, computer tablets, MP3 players, and smart phones use miniature speakers. In many applications, these devices utilize switching amplifiers to efficiently provide for amplification of an audio signal. In one example, a switching amplifier may provide twenty watts of power to amplify an audio signal and drive a speaker. Due to limitations of miniature speakers used in such devices, the current to the speakers may be measured to aid in the prevention of physical damage to the speaker and other unwanted effects. Thus, there is a continued need to improve the measurement of current provided to the speaker by the switching amplifier in order to protect the speaker from damage.

SUMMARY

The present disclosure provides systems and methods that address a need in the art for improved sensing of a current provided to a load by a switching amplifier. The scope of the disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

The included drawings are for illustrative purposes and serve only to provide examples of possible systems and methods for sensing current in an audio system. These drawings in no way limit any changes in form and detail that may be made to that which is disclosed by one skilled in the art without departing from the spirit and scope of this disclosure.

DETAILED DESCRIPTION

The present disclosure describes systems and methods that address a need for accurate sensing of a current provided by a switching amplifier, such as a class-D switching amplifier, used in many modern audio amplifier applications. In one embodiment, an audio system of the present disclosure includes a switching amplifier H-bridge output stage, and one or more output current sensing circuits. Each output current sensing circuit includes a current mirror circuit and a sample and hold circuit configured to provide for sensing an average current traveling through a load during all phases of amplifier switching.

Embodiments of the present disclosure may be contrasted to pre-existing solutions for sensing a current at an output of a class-D switching amplifier. For example, conventional audio systems may sense a load current using a current mirror circuit. However, performance of current mirror circuits may be affected by common mode limitations. For example, a conventional current mirror circuit used for switching amplifier applications is subject to large voltage swings at the output transistor switches connected to inputs of the current mirror circuit. Large voltage swings at the input require a current mirror with a relatively high common mode rejection ratio. Moreover, a current mirror circuit used without support circuitry does not provide for accurate current sensing when switching transistors are in transition between "on" and "off" states. Various embodiments of the present disclosure address these and other issues to accurately and effectively sense the current being provided to the load by a switching amplifier in order to protect the load, such as a speaker, from damage.

Figure 1:
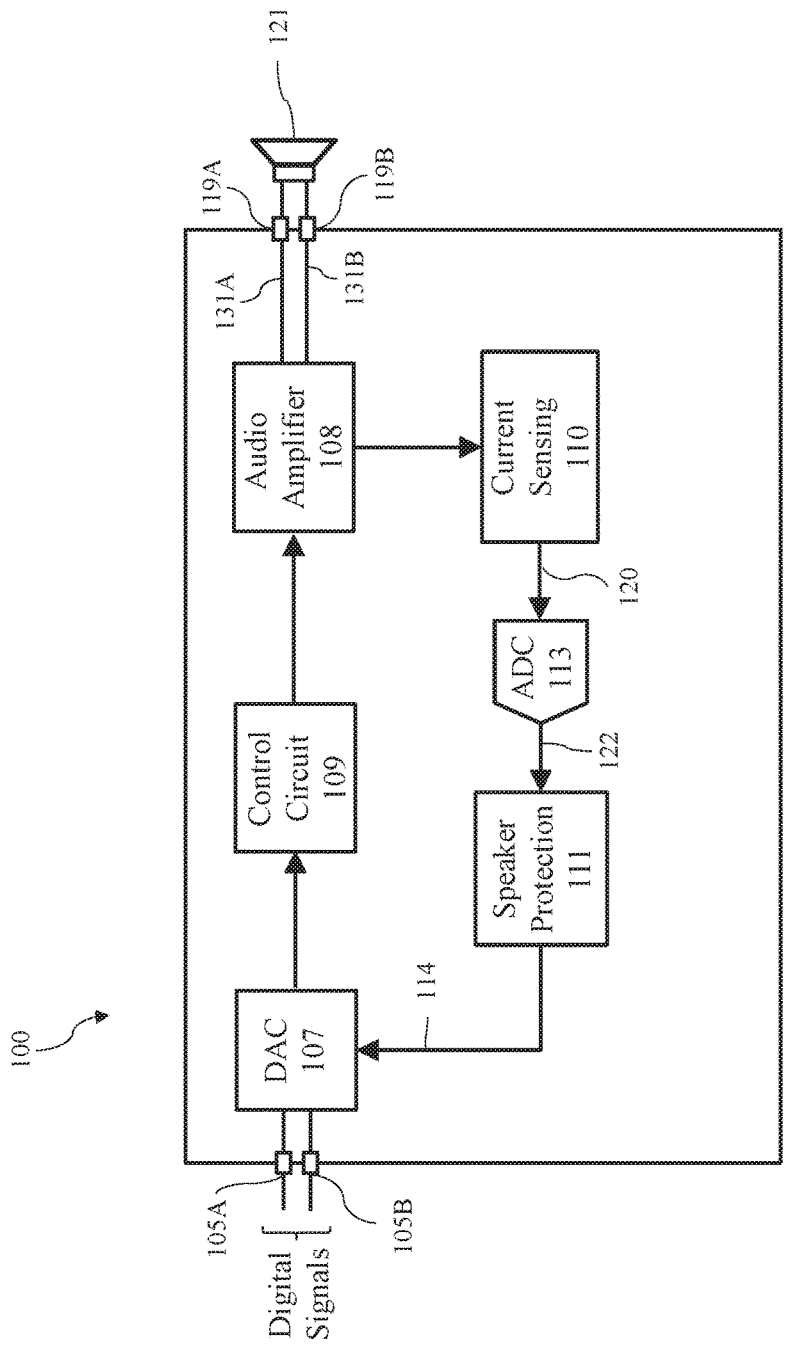
FIG. 1 illustrates an exemplary audio codec in accordance with an embodiment of the disclosure.

FIG. 1 illustrates a block diagram of an exemplary audio codec circuit 100 in accordance with an embodiment of the disclosure. Audio codec circuit 100 provides analog and digital circuitry for signal processing of audio inputs. Audio codec circuit 100 includes circuitry to process the digital signals and provide amplified analog output signals to a speaker, for example, for example speaker 121. In some embodiments, audio codec circuit 100 receives digital signals at input ports 105A-B. Digital signals may be associated with, for example, electronic device such as a laptop computer, a computer tablet, a smart phone, or a sensor such as a microphone.

Digital-to-analog converter (DAC) 107 may be configured to receive digital signals and convert the digital signals to analog signals for further processing. Control circuit 109 receives analog audio signals from DAC 107 and processes the analog audio signals. In some embodiments, control circuit 109 provides pulse width modulated signals to audio amplifier 108. In some embodiments, audio amplifier 108 is implemented as a class-D switching amplifier and pulse width modulated signals control a switching duty cycle of audio amplifier 108. Audio amplifier 108 amplifies the received analog audio signals and provides amplified audio signals 131A-B to drive an output device 121 at output jacks 119A-B. Output device 121 may be a loudspeaker, headphones or another electronic device for receiving amplified audio signals 131A-B.

Audio amplifier 108 is electrically coupled to current sensing circuit 110. Current sensing circuit 110 is configured to sense the current signal traveling to output device 121 from audio amplifier 108. In some embodiments, current sensing circuit 110 measures an approximately equivalent sensed current associated with the current signal traveling through output device 121 and converts the sensed current to an analog voltage signal 120.

Current sensing circuit 110 may provide analog voltage signal 120 to an analog-to-digital converter (ADC) 113. ADC 113 converts the analog voltage signal to a digital voltage signal 122 and provides digital voltage signal 122 to a speaker protection circuit 111. In some embodiments, speaker protection circuit 111 processes digital voltage signal 122 to determine if adjustments to the pulse width modulated signals are required. In some embodiments, speaker protection circuit 111 provides DAC 107 with signals 114 to adjust DAC 107 signal processing based on the sensed current associated with the current signal traveling through output device 121.

Figure 2:
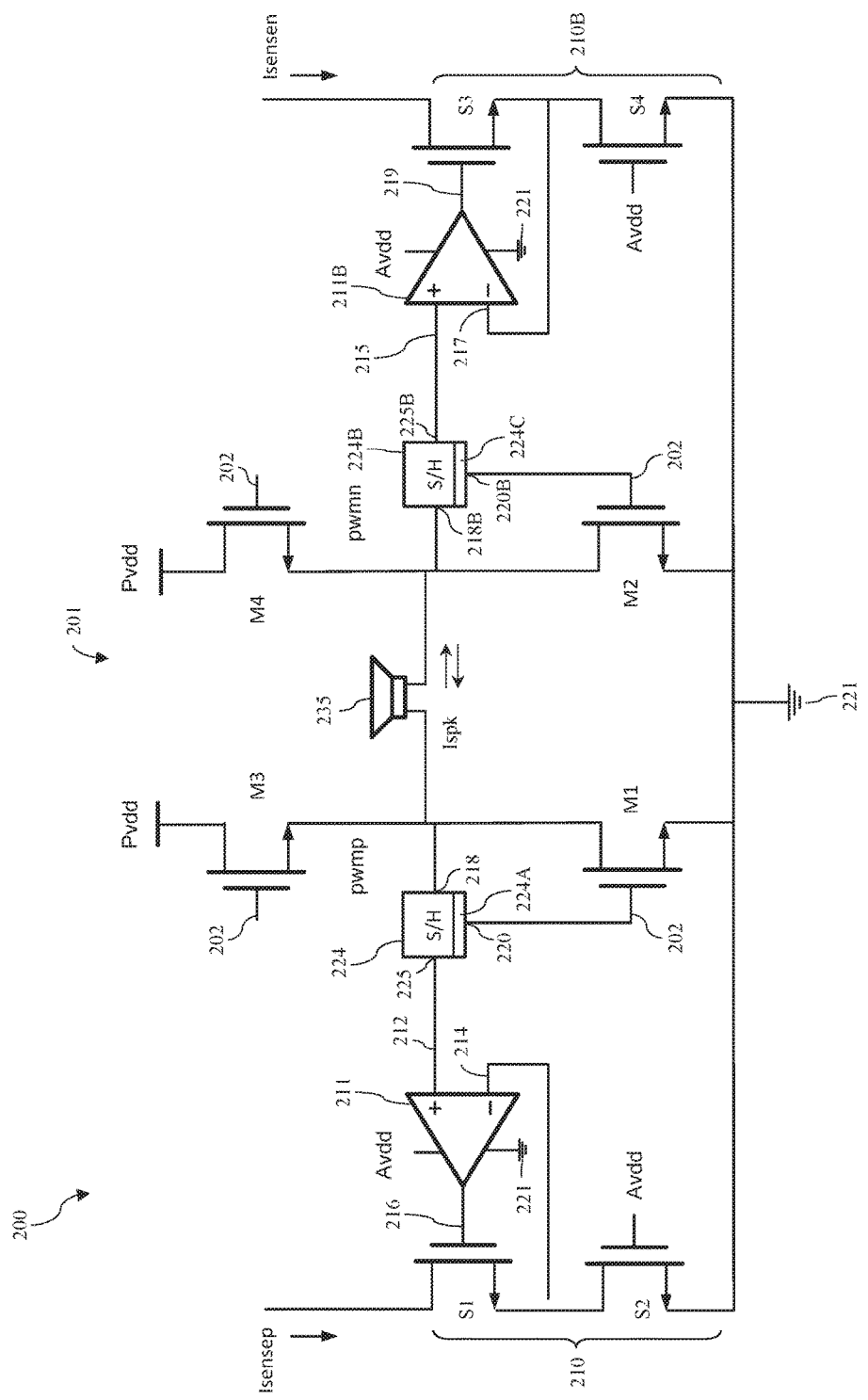
FIG. 2 illustrates an exemplary audio amplifier output driver in accordance with an embodiment of the disclosure.

FIG. 2 illustrates a schematic diagram of an audio amplifier output driver 200 in accordance with an embodiment of the disclosure. In some embodiments, audio amplifier output driver 200 forms part of audio amplifier 108 that is implemented in audio codec circuit 100 of FIG. 1. Audio amplifier output driver 200 provides an audio output drive to a speaker load 235 used in a mobile phone, laptop computer, tablet, audio/video system, or other similar portable devices that require an audio amplifier output driver 200. In various embodiments, audio amplifier output driver 200 is implemented as a class-D amplifier H-bridge output stage 201. Audio amplifier output driver 200 further includes one or more current sensing circuits 210.

In the illustrated embodiment of FIG. 2, H-bridge output stage 201 includes four n-channel laterally diffused metal oxide semiconductor field-effect transistors (MOSFET) M1, M2, M3, and M4. The respective drains of the first two, high side, transistors M3, M4 are connected to a supply voltage Pvdd. In some embodiments, supply voltage Pvdd provides twelve volts DC power to transistors M3, M4. However, other power supply voltages may be provided in other embodiments. The respective sources are connected to drains of two low side transistors M1, M2 whose sources are connected to ground 221. A speaker load 235 is connected between transistor switch pairs M3, M1 and M4, M2. Control circuit 109 of FIG. 1 provides pulse width modulated (PWM) control signals 202 to gates of transistors M1, M2, M3, and M4. In some embodiments, a first pulse width modulated (PMW) control signal 202 is connected to a gate terminal of transistor M3, a second PMW control signal 202 is connected to a gate terminal of transistor M1, a third PMW control signal 202 is connected to a gate terminal of transistor M4, and a fourth PMW control signal 202 is connected to a gate terminal of transistor M2.

In some embodiments, a first current sensing circuit 210 includes a current mirror amplifier 211 (e.g., a current sensing device), n-channel MOS transistors S1 and S2, and a sample and hold circuit 224. Current Ispk traveling through speaker load 235 is mirrored by an equivalent current Isensep.

Current mirror amplifier 211 includes two input terminals, non-inverting input terminal 212 and inverting input terminal 214. Non-inverting input terminal 212 is connected to an output 225 of sample and hold circuit 224. Inverting input terminal 214 of current mirror amplifier 211 is connected to source terminal of transistor S1 and drain terminal of transistor S2. Current mirror amplifier 211 output signal 216 is connected to gate terminal of transistor S1 to drive transistor S1. Source terminal of transistor S2 is connected to ground signal 221. Drain terminal of transistor S1 is connected to Isensep current signal.

Sample and hold circuit 224 is configured to receive transistor M1 drain-source voltage (e.g., a small signal drain voltage) and provide the small signal voltage to the current mirror amplifier 211 for a pre-determined sample time period. In some embodiments, drain voltage of transistor M1 is approximately fifty to one hundred millivolts during the sample time period. Other small signal voltages are possible in other embodiments. In some embodiments, sample and hold circuit 224 is implemented as a capacitor and a field-effect transistor switch. The capacitor is charged to approximately the voltage level of the small signal drain voltage of transistor M1. The charged voltage is switched to an output 225 of sample and hold circuit 224 and provided to non-inverting input terminal 212 of current mirror amplifier 211 for the pre-determined sample time period. In this regard, sample and hold circuit 224 effectively holds the small signal voltage at the input of current mirror amplifier 211 to enable measurement of current Isensep (e.g., or Isensen for the complementary circuit) for a pre-determined sample time period, as discussed herein.

Sample and hold circuit 224 includes an input port 218 that is connected to source terminal of transistor M3 and drain terminal of transistor M1. Sample and hold circuit 224 includes a trigger port 220 to receive an M1 gate voltage signal that controls a sample action and a hold action of sample and hold circuit 224. In this regard, a sample action is triggered by an edge transition of a gate pulse at M1 and sample action stops (e.g. times out) at a midpoint of the gate pulse. The hold action starts at the completion of the sample action and the hold action stops (e.g. times out) just prior to the start of the next sample action. In some embodiments, a small signal DC voltage of approximately fifty to one hundred millivolts is provided at input port 218 during the time period low side transistor M1 is turned on. In some embodiments, the pre-determined sample and hold time period may be approximately three microseconds, however, other sample and hold time periods are possible in other embodiments. In some embodiments, sample and hold circuit 224 may include control logic to perform adjustments to the pre-determined sample time period.

Current mirror amplifier 211 output signal 216 controls a gate voltage of S1 to adjust a drain-source voltage across S2. In this regard, the voltage across transistor M1, and equivalently at output 225 of sample and hold circuit 224, is mirrored across transistor S2 to provide a Isensep current signal flowing through switches S1 and S2 that is approximately equal to load current Ispk. In some embodiments, current mirror amplifier 211 (e.g., and similarly current mirror amplifier 211B) is implemented as a laterally diffused metal oxide semiconductor device.

In some embodiments, a complementary second current sensing circuit 210B includes a current mirror amplifier 211B, n-channel MOS transistors S3 and S4, and sample and hold circuit 224B. Current Ispk traveling through speaker load 235 at the H-bridge complementary transistor pair (e.g., M4 and M2) is represented by an equivalent measured current Isensen.

Current mirror amplifier 211B includes two input terminals, non-inverting input terminal 215 and inverting input terminal 217. Non-inverting input terminal 215 is connected to an output 225B of sample and hold circuit 224B. Inverting input terminal 217 of current mirror amplifier 211B is connected to source terminal of transistor S3 and drain terminal of transistor S4. Current mirror amplifier 211B output signal 219 is connected to gate terminal of transistor S3 to drive transistor S3. Source terminal of transistor S4 is connected to ground signal 221. Drain terminal of transistor S1 is connected to Isensen current signal.

Sample and hold circuit 224B includes an input port 218B that is connected to source terminal of transistor M4 and drain terminal of transistor M2. A sample and hold trigger port 220B is connected to gate terminal of low side transistor M2. In this regard, as fourth PWM control signal 202 turns on transistor M2, a triggering circuit 224C within sample and hold circuit 224B is configured to trigger sample and hold circuit 224B to sample M2 drain voltage at a midpoint of the fourth PWM control signal 202 time period, as discussed herein. In some embodiments, a small signal DC voltage of approximately fifty to one hundred millivolts is provided at input port 218B during the time period low side transistor M2 is turned on. Current mirror amplifier 211B output signal 219 controls a gate voltage of S3 to adjust a drain-source voltage across S4. In this regard, the voltage across transistor M2, and equivalently at output 225B of sample and hold circuit 224B, is mirrored across transistor S4 to provide a Isensen current signal flowing through switches S3 and S4 that is approximately equal to load current Ispk.

As shown in FIG. 2, transistors S2 and S4 reproduce current flowing in speaker load 235. Speaker load 235 is connected between source of M3 and drain of M1 on a first end and source of M4 and drain of M2 on a second end. Transistor S2 reproduces a current flowing through transistor M1 (e.g., a second transistor switch) during the PWM cycles when M1 is conducting. Current Ispk flows from drain to source of M1 when M1 is conducting. Current mirror amplifier 211 output signal 216 drives a gate of transistor S1 to turn on transistor S1 allowing current Isensep to flow through transistor S1. Power supply Avdd is connected to gates of transistors S2 and S4 to turn on transistor S2 and S4 when audio amplifier output driver 200 is powered.

In a similar manner, transistor S4 reproduces a current flowing through transistor M2 during the PWM cycles when M2 is conducting. Current Ispk flows from drain to source of M2 when M2 is conducting. Current mirror amplifier 211B output signal 219 drives a gate of transistor S3 to turn on transistor S3 allowing current Isensen to flow through S3. In this regard, a speaker load 235 current is sensed for the complete range of Ispk current when Ispk flows through combined transistors M1 and M2.

Figure 3:
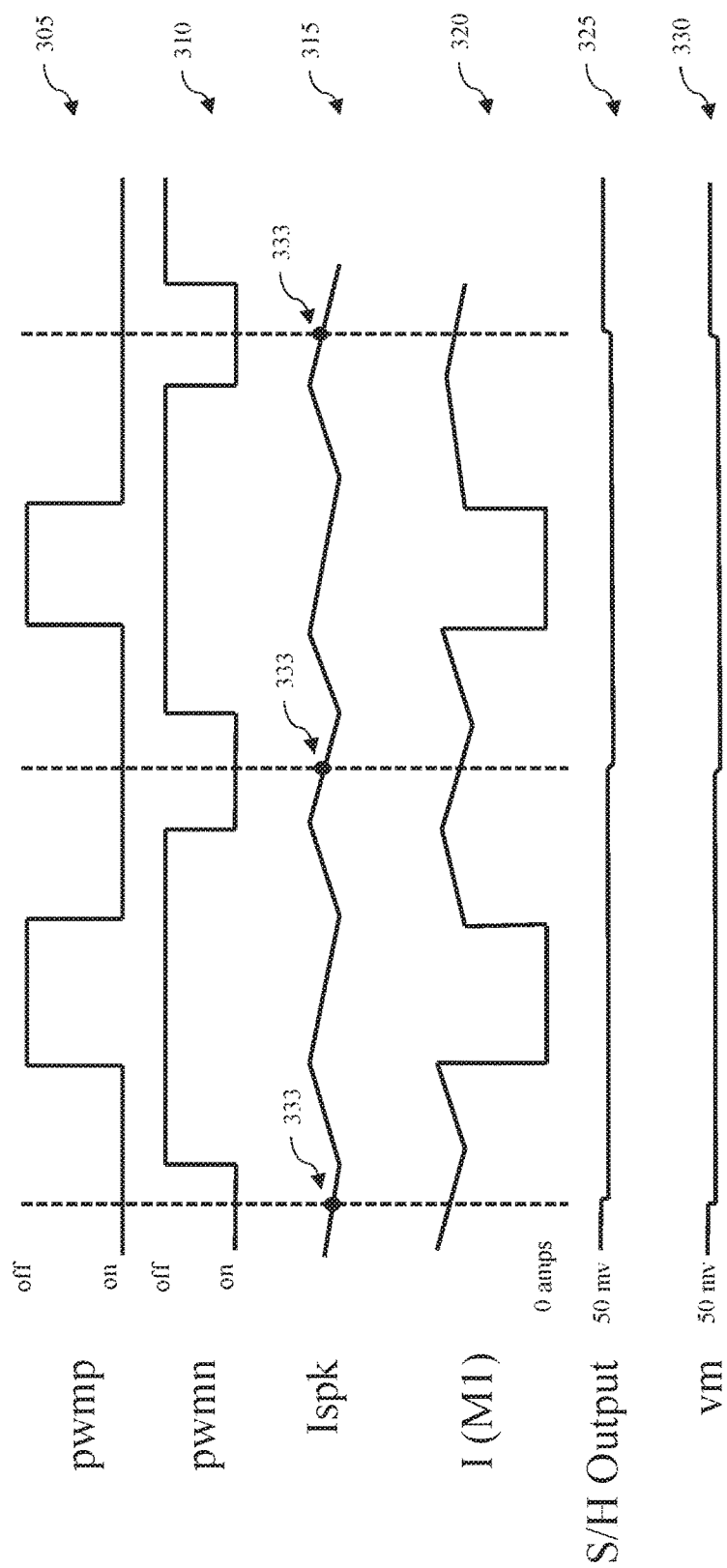
FIG. 3 illustrates exemplary plots of amplifier output stage voltages and output current of an audio amplifier output driver in accordance with an embodiment of the disclosure.

FIG. 3 illustrates exemplary plots of amplifier output stage voltages pwmp and pwmn, and output current Ispk of an audio amplifier output driver in accordance with an embodiment of the disclosure. Plot 305 illustrates a voltage at node pwmp of FIG. 2 during a cyclical time period when second pulse width modulated control signal is turning on and turning off transistor M1. Plot 310 illustrates a voltage at node pwmn of FIG. 2 during a cyclical time period when fourth pulse width modulated control signal is turning on and turning off transistor M2.

As shown in FIG. 3, duty cycles of pulse width modulated control signals may be varied to adjust a load current Ispk illustrated in plot 315. Plot 320 illustrates the current flowing through transistor M1 during a time period when M1 is turned on and turned off. As illustrated, the current flowing through M1 may vary based on a duty cycle of transistor M2 illustrated by plot 310 and a duty cycle of transistors M3 and M4 (not shown). The sample and hold circuit 224 is configured to sense the current Ispk at a midpoint of the second pulse width modulated control signal time period (e.g., as illustrated by midpoint of pwmp) when transistor M1 and M2 are turned "on". Sample and hold circuit 224 is configured to sample the drain voltage of M1 for a pre-determined sample time period in response to the midpoint of second pulse width modulated control signal as illustrated in plot 305 by the dashed line at the midpoint of pwmp "on" level.

The output of the sample and hold circuit as illustrated in plot 325 is a stable voltage representative of the current flowing though Ispk when M1 is on. Sample and hold circuit 224 provides the voltage at node pwmp (e.g., drain voltage of transistor M1) to non-inverting input terminal 212 of current mirror amplifier 211 during the sample time period. Sample and hold circuit 224 is configured to sample the drain voltage (e.g., at the drain terminal of transistor M1) at successive pulses as shown by samples 333 on plot 315. Plot 330 shows the corresponding voltage vm at inverting input terminal 214 during the sample time period.

Figure 4:
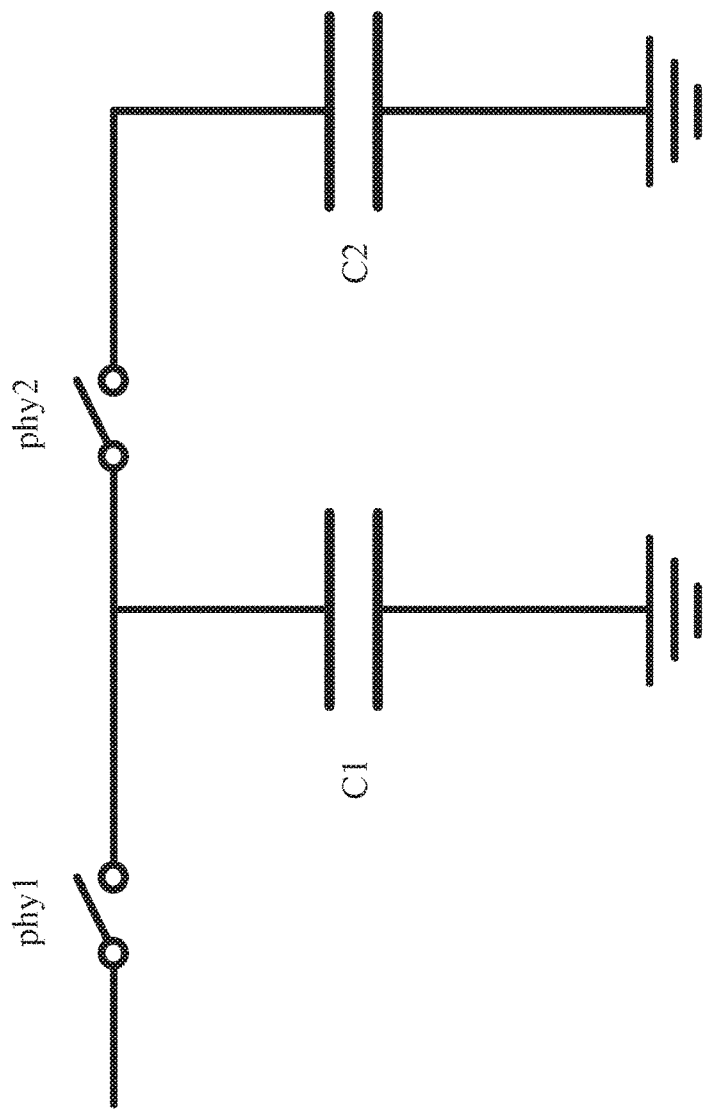
FIG. 4 illustrates a schematic diagram of an exemplary sample and hold output circuit in accordance with an embodiment of the disclosure.

FIG. 4 illustrates a schematic diagram of a sample and hold output circuit in accordance with an embodiment of the disclosure. In some embodiments, capacitors C1 and C2 are charged to a level of the drain voltage at transistor M1 during a corresponding sample time period. A first capacitor C1 is charged during a time when switch phy1 is closed corresponding to a first sample time period. A second capacitor C2 is charged during a time when switch phy2 is closed corresponding to a second sample time period. In this regard, successive sample time periods may be averaged to generate an averaged sampled voltage and provide the averaged sampled voltage at non-inverting input terminal 212 of current mirror amplifier 211. In some embodiments, the sample and hold circuit may include control logic (not shown) to perform the transfer function of the following equation, which illustrates an output transfer function for the averaging sample and hold circuit:

$$Y = \frac{1}{1 - \frac{Z^{-1}C2}{C1+C2}}$$

Figure 5:
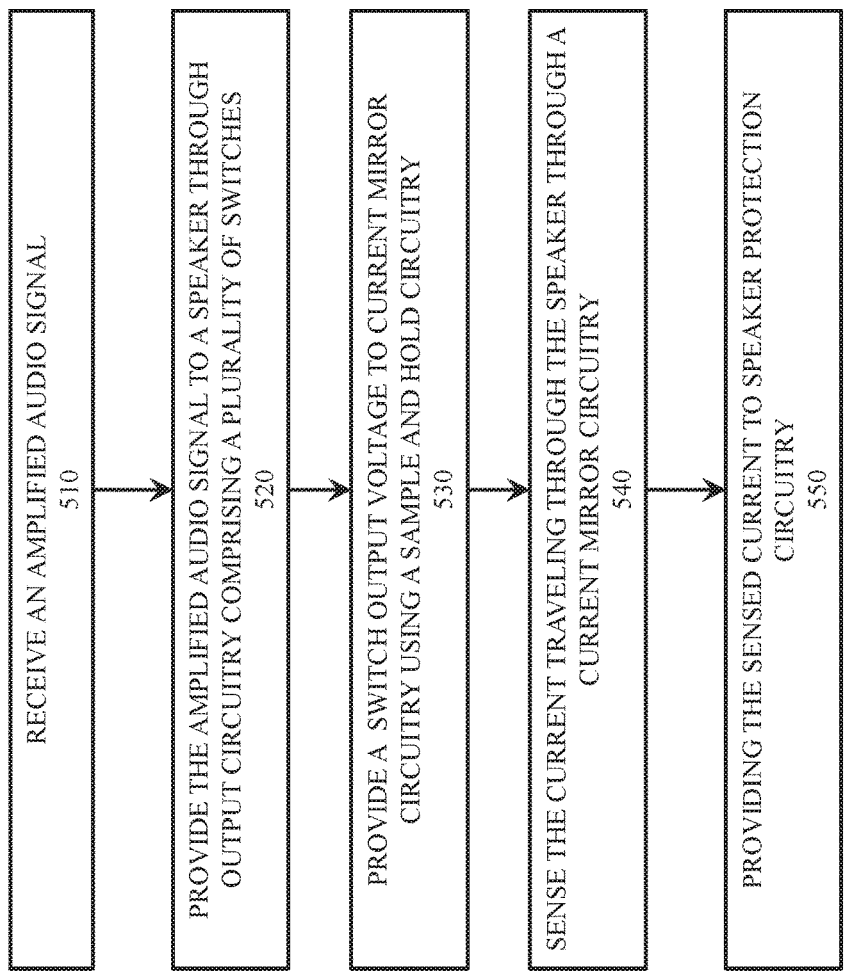
FIG. 5 illustrates an exemplary process flow for an audio amplifier output driver speaker protection system in accordance with an embodiment of the disclosure.

FIG. 5 illustrates a process flow for an audio amplifier output driver speaker protection in accordance with an embodiment of the disclosure. In block 510, the flow diagram begins with receiving an amplified audio signal at an output of audio amplifier output driver 200. Audio amplifier output driver 200 includes an H-bridge output stage 201 including two high side/low side output transistor switch pairs, each pair connected to a respective end of speaker load 235 to conduct a current through speaker load 235. In some embodiments, each high side transistor switch is connected to a twelve volt DC power supply and each low side transistor switch is connected to ground signal 221 to drive speaker load 235.

In block 520, the flow diagram continues with providing the amplified audio signal to a speaker load 235. For example, a first pulse width modulated control signal is coupled to a gate terminal of a first transistor switch (e.g., high side switch M3) to control an "on" and "off" state of the first transistor switch. A second pulse width modulated control signal is coupled to a gate terminal of a second transistor switch (e.g., low side switch M1) to control an "on" and "off" state of the second transistor switch. H-bridge output stage 201 includes a complementary high side/low side transistor switch pair (e.g., M4/M2) connected to a second end of speaker load 235 and are controlled by complementary pulse width modulated control signals 202.

In block 530, the flow diagram continues with sample and hold circuit 224 receiving a small signal drain voltage at the second transistor switch responsive to a midpoint of the second pulse width modulated control signal. In some embodiments, sample and hold circuit 224 may average two or more successive sampled voltages to generate an averaged sample voltage. Sample and hold circuit 224 may provide the averaged sample voltage to the current mirror amplifier 211 for a pre-determined sample time period.

In block 540, the flow diagram continues with current sensing circuit 210 sensing the current traveling through speaker load 235. Current mirror amplifier 211 provides for accurate current measurements of a representative current signal, Isensep that is approximately equal to the current flowing through speaker load 235. Current sensing circuit 210 provides a measured current value that is accurate and stable during the sample time period of sample and hold circuit 224. H-bridge output stage 201 includes a complementary second current sensing circuit 210B configured to sense the equivalent speaker current Isesnsen at the complementary high side/low side switch pair. In this regard, a speaker load 235 current is sensed for the complete range of speaker current comprising Isensep and Isensen.

In block 550, current sensing circuit 210 may provide analog voltage signals of measured currents Isensep and Isensen to an ADC 113 for conversion to digital sense signals (e.g., digitized signals) that are passed to a speaker protection circuit 111. Speaker protection circuit 111 may process the digital sense signals and provide gain adjustments to DAC 107 to adjust a speaker load 235 current at outputs of audio amplifier output driver 200. In some embodiments, DAC 107 may adjust a frequency of the first and second pulse width modulated control signals to reduce the current traveling through the speaker load 235 when the speaker load current Ispk exceeds an upper current threshold.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

Software, in accordance with the present disclosure, such as program code and/or data, may be stored on one or more computer readable mediums. It is also contemplated that software identified herein may be implemented using one or more general purpose or specific purpose computers and/or computer systems, networked and/or otherwise. Where applicable, the ordering of various steps described herein may be changed, combined into composite steps, and/or separated into sub-steps to provide features described herein.

Embodiments described above illustrate but do not limit the invention. It should also be understood that numerous modifications and variations are possible in accordance with the principles of the present invention. Accordingly, the scope of the invention is defined only by the following claims.

What is claimed is:

1. A system comprising:
    a first transistor switch coupled to a load at a source terminal operable to conduct a current in the load responsive to a first pulse width modulated control signal coupled to a gate terminal of the first transistor switch;
    a second transistor switch coupled to the load at a drain terminal operable to conduct the current in the load responsive to a second pulse width modulated control signal coupled to a gate terminal of the second transistor switch, wherein the drain terminal of the second transistor switch is coupled to the source terminal of the first transistor switch; and
    a sample and hold circuit coupled between the load and a current sensing circuit operable to sample a voltage at the drain terminal of the second transistor switch for a pre-determined sample time period in response to a midpoint of a second pulse width modulated control signal time period, and operable to provide the sampled voltage to the current sensing circuit.

2. The system of claim 1, wherein the sample and hold circuit is operable to sample the drain voltage at the midpoint of each of a plurality of successive second pulse width modulated control signal time periods to provide a plurality of successive sampled voltages.

3. The system of claim 2, wherein the sample and hold circuit further comprises a triggering circuit operable to trigger the sample and hold circuit to sample the drain voltage at the midpoint of each of the plurality of successive second pulse width modulated control signal time periods.

4. The system of claim 2, wherein the sample and hold circuit is operable to average two or more of the plurality of successive sampled voltages to generate an averaged sampled voltage, and wherein the sample and hold circuit is further operable to provide the averaged sampled voltage to the current sensing circuit for the pre-determined sample time period.

5. The system of claim 4, wherein the current sensing circuit is a current mirror circuit, wherein the sample and hold circuit is further operable to provide the averaged sampled voltage for the pre-determined sample time period to the current mirror circuit, and wherein the current mirror circuit is operable to sense the current traveling through the load responsive to the averaged sampled voltage.

6. The system of claim 5, wherein the current sensing circuit is coupled to a speaker protection circuit operable to provide a digitized signal corresponding to the sensed current to the speaker protection circuit, wherein the speaker protection circuit is operable to adjust a frequency of the first and second pulse width modulated control signals to reduce the current traveling through the load when the current in the load exceeds an upper current threshold.

7. The system of claim 1, wherein the load comprises a speaker.

8. The system of claim 1, wherein the first and second transistor switches comprise a class-D amplifier H-bridge output stage.

9. The system of claim 1, wherein the first transistor switch and the second transistor switch comprise n-channel laterally diffused metal oxide semiconductor field-effect transistors.

10. The system of claim 1, the system further comprising:
    a third transistor switch coupled to the load at a source terminal operable to conduct the current in the load responsive to a third pulse width modulated control signal coupled to a gate terminal of the third transistor switch;
    a fourth transistor switch coupled to the load at a drain terminal operable to conduct the current in the load responsive to a fourth pulse width modulated control signal coupled to a gate terminal of the fourth transistor switch, wherein the drain terminal of the fourth transistor switch is connected to the source terminal of the third transistor switch; and
    a second sample and hold circuit coupled between the load and a second current sensing circuit operable to sample a second voltage at the drain terminal of the fourth transistor switch for a pre-determined sample time period in response to a midpoint of a fourth pulse width modulated control signal time period, and operable to provide the second sampled voltage to the second current sensing circuit.

11. A method comprising:
conducting a current in a load responsive to a first pulse width modulated control signal coupled to a gate terminal of a first transistor switch;
conducting the current in the load responsive to a second pulse width modulated control signal coupled to a gate terminal of a second transistor switch; and
sampling a voltage at a drain terminal of the second transistor switch for a pre-determined sample time period in response to a midpoint of a second pulse width modulated control signal time period to provide the sampled voltage to a current sensing circuit.

12. The method of claim 11, wherein the sampling further comprises sampling the drain voltage at the midpoint of each of a plurality of successive second pulse width modulated control signal time periods to provide a plurality of successive sampled voltages.

13. The method of claim 12, further comprising a triggering circuit, the method further comprises sampling the drain voltage at the midpoint of each of a plurality of successive second pulse width modulated control signal time periods responsive to the triggering circuit.

14. The method of claim 12, further comprising:
averaging two or more of the plurality of successive sampled voltages to generate an averaged sampled voltage; and
receiving the averaged sampled voltage for the pre-determined sample time period at an input of the current sensing circuit.

15. The method of claim 14, wherein the current sensing circuit is a current mirror circuit, the method further comprising:

receiving the averaged sampled voltage for the pre-determined sample time period at an input of the current mirror circuit; and
sensing the current traveling through the load responsive to the averaged sampled voltage.

16. The method of claim 15, wherein the current sensing circuit is coupled to a speaker protection circuit, the method further comprising:
receiving a digitized signal corresponding to the sensed current at the speaker protection circuit; and
adjusting a frequency of the first and second pulse width modulated control signals to reduce the current traveling through the load when the current in the load exceeds an upper current threshold.

17. The method of claim 11, wherein the load comprises a speaker.

18. The method of claim 11, wherein the first and second transistor switches comprise a class-D amplifier H-bridge output stage.

19. The method of claim 11, wherein the first transistor switch and the second transistor switch comprise n-channel laterally diffused metal oxide semiconductor field-effect transistors.

20. The method of claim 11, further comprising:
conducting the current in the load responsive to a third pulse width modulated control signal coupled to a gate terminal of a third transistor switch;
conducting the current in the load responsive to a fourth pulse width modulated control signal coupled to a gate terminal of a fourth transistor switch; and
sampling a second voltage at a drain terminal of the fourth transistor switch for a pre-determined sample time period in response to a midpoint of a fourth pulse width modulated control signal time period to provide the second sampled voltage to a second current sensing circuit.

* * * * *